(12) United States Patent
Mizugaki

(10) Patent No.: US 11,575,079 B2
(45) Date of Patent: Feb. 7, 2023

(54) VIBRATION DEVICE

(71) Applicant: SEIKO EPSON CORPORATION, Tokyo (JP)

(72) Inventor: Koichi Mizugaki, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 330 days.

(21) Appl. No.: 17/030,711

(22) Filed: Sep. 24, 2020

(65) Prior Publication Data

US 2021/0098680 A1 Apr. 1, 2021

(30) Foreign Application Priority Data

Sep. 27, 2019 (JP) .............................. JP2019-176765

(51) Int. Cl.
| | |
|---|---|
| *H03H 9/17* | (2006.01) |
| *H01L 41/047* | (2006.01) |
| *B06B 1/06* | (2006.01) |
| *H01G 5/18* | (2006.01) |

(52) U.S. Cl.
CPC ........ *H01L 41/0471* (2013.01); *B06B 1/0644* (2013.01); *H01G 5/18* (2013.01); *H03H 9/17* (2013.01)

(58) Field of Classification Search
CPC ..... H01L 41/0471; H01G 5/40; B06B 1/0644; H03H 9/17
See application file for complete search history.

(56) References Cited

U.S. PATENT DOCUMENTS

| | | | |
|---|---|---|---|
| 2005/0258548 A1* | 11/2005 | Ogawa | .................... H01G 4/236 257/737 |
| 2015/0102395 A1* | 4/2015 | Park | .................. H01L 29/66181 257/301 |
| 2018/0048285 A1 | 2/2018 | Nishimura et al. | |
| 2021/0067093 A1* | 3/2021 | Matsuzawa | ............. H03L 1/022 |
| 2022/0166405 A1* | 5/2022 | Itomi | ................. H03H 9/02102 |

FOREIGN PATENT DOCUMENTS

| | | |
|---|---|---|
| JP | 2006-019387 | 1/2006 |
| WO | 2016/159018 | 10/2016 |

* cited by examiner

*Primary Examiner* — J. San Martin
(74) *Attorney, Agent, or Firm* — Rankin, Hill & Clark LLP

(57) ABSTRACT

A vibration device includes a semiconductor substrate having a first surface and a second surface in an obverse-reverse relationship, a vibration element disposed on the first surface, a lid bonded to the first surface, an integrated circuit disposed on the first surface, a terminal disposed on the second surface, a through electrode which penetrates the semiconductor substrate, and is configured to electrically couple the terminal and the integrated circuit to each other, and a first capacitor which is provided with a first recess provided to the semiconductor substrate and opening in the first surface, an insulating film disposed on an inside surface of the first recess, and an electrically-conductive material filling the first recess, and has a first capacitance between the electrically-conductive material and the semiconductor substrate, wherein the electrically-conductive material does not have contact with the terminal at the second surface side.

7 Claims, 11 Drawing Sheets

VIBRATION DEVICE

The present application is based on, and claims priority from JP Application Serial Number 2019-176765, filed Sep. 27, 2019, the disclosure of which is hereby incorporated by reference herein in its entirety.

BACKGROUND

1. Technical Field

The present disclosure relates to a vibration device.

2. Related Art

The vibration device described in International Publication No. WO 2016/159018 (Document 1) has a vibration provided with an upper part electrode and a lower part electrode, an upper lid disposed so as to seal an upper surface of the vibration, a lower lid disposed so as to seal a lower surface of the vibration, a power supply terminal provided to the upper lid and electrically coupled to the upper part electrode via a through hole having an interconnection, a ground terminal disposed on an upper surface of the upper lid and electrically coupled to the lower part electrode via the upper lid, and an insulating layer intervening between the upper lid and the through hole. Further, a capacitance is formed between the upper lid and the power supply terminal via the insulating layer.

However, when forming the capacitance using a through electrode for electrically coupling the upper part electrode and the power supply terminal to each other, the use of the through electrode is determined in accordance with a circuit configuration, and the capacitance formed using the through electrode is determined in accordance therewith. Therefore, when attempting to use the capacitance for a frequency adjustment, there is a possibility that the necessary capacitance cannot be obtained. In other words, in Document 1, there is a possibility that the capacitance suitable for the frequency adjustment cannot be formed.

SUMMARY

A vibration device according to an application example includes a semiconductor substrate having a first surface and a second surface in an obverse-reverse relationship, a vibration element disposed on the first surface, a lid bonded to the first surface, an integrated circuit disposed on the first surface, a terminal disposed on the second surface, a through electrode which penetrates the semiconductor substrate, and is configured to electrically couple the terminal and the integrated circuit to each other, and a first capacitor which is provided with a first recess provided to the semiconductor substrate and opening in the first surface, an insulating film disposed on an inside surface of the first recess, and an electrically-conductive material filling the first recess, and has a first capacitance between the electrically-conductive material and the semiconductor substrate, wherein the electrically-conductive material does not have contact with the terminal at the second surface side.

In the vibration device according to the application example, the integrated circuit may include an oscillation circuit configured to oscillate the vibration element to output an oscillation signal, and the first capacitor may be used to adjust a frequency of the oscillation signal.

In the vibration device according to the application example, there may further be included a second capacitor which is provided with a second recess provided to the semiconductor substrate and opening in the first surface, an insulating film disposed on an inside surface of the second recess, and an electrically-conductive material filling the second recess, and has a second capacitance different from the first capacitance between the electrically-conductive material and the semiconductor substrate.

In the vibration device according to the application example, an opposed area of the second capacitor to the semiconductor substrate may be different from an opposed area of the first capacitor to the semiconductor substrate.

In the vibration device according to the application example, the second recess may be different in depth from the first recess.

In the vibration device according to the application example, in a plan view of the semiconductor substrate, the second capacitor may be different in length from the first capacitor.

In the vibration device according to the application example, there may further be included a frame which penetrates the semiconductor substrate, and has an insulating property, wherein the first capacitor may be disposed inside the frame, and an area inside the frame of the semiconductor substrate may have a potential different from a substrate potential.

DESCRIPTION OF EXEMPLARY EMBODIMENTS

A vibration device according to the present application example will hereinafter be described in detail based on some embodiments shown in the accompanying drawings.

First Embodiment

Figure 1:
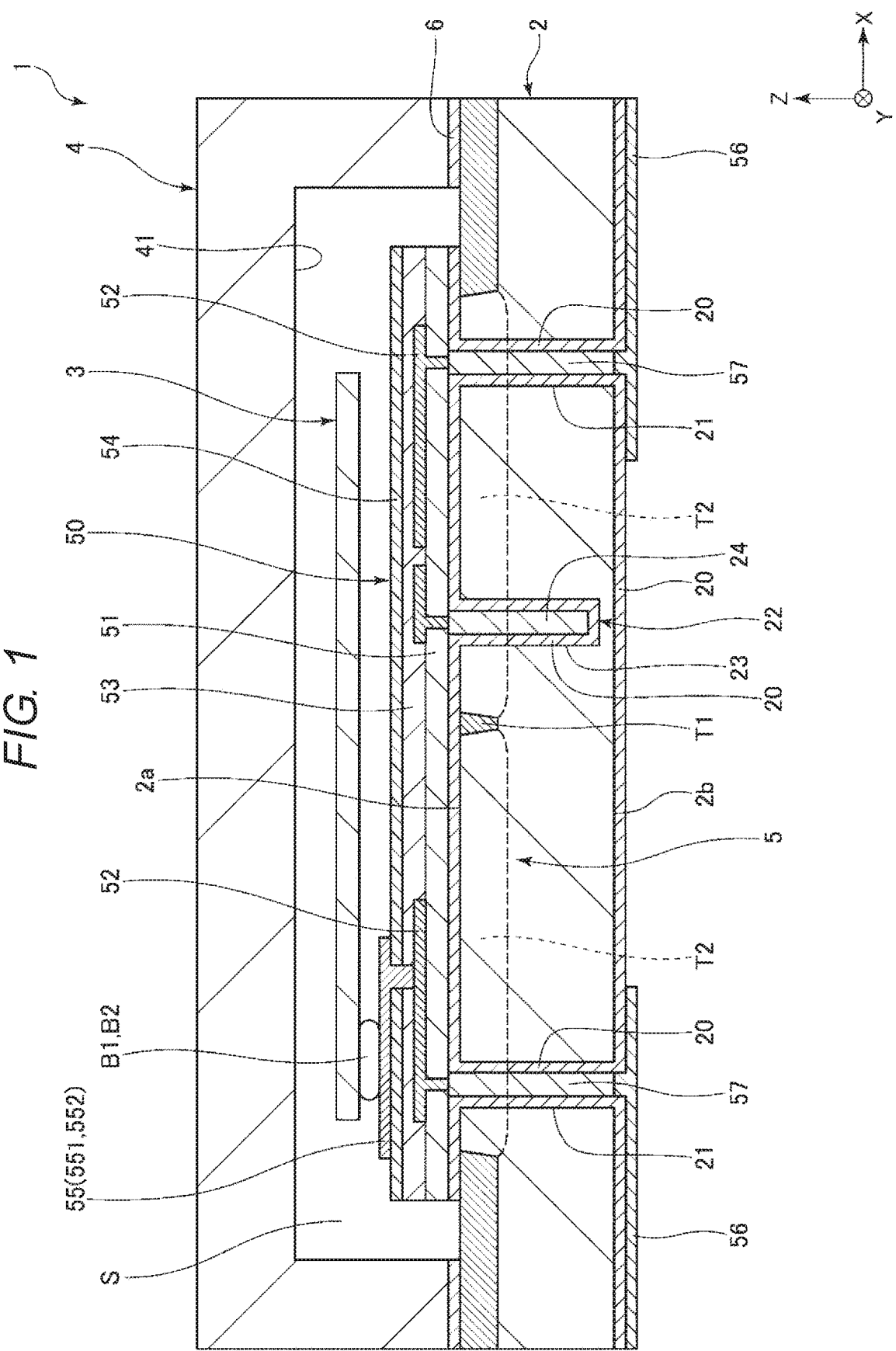
FIG. 1 is a cross-sectional view showing a vibration device according to a first embodiment.
Figure 2:
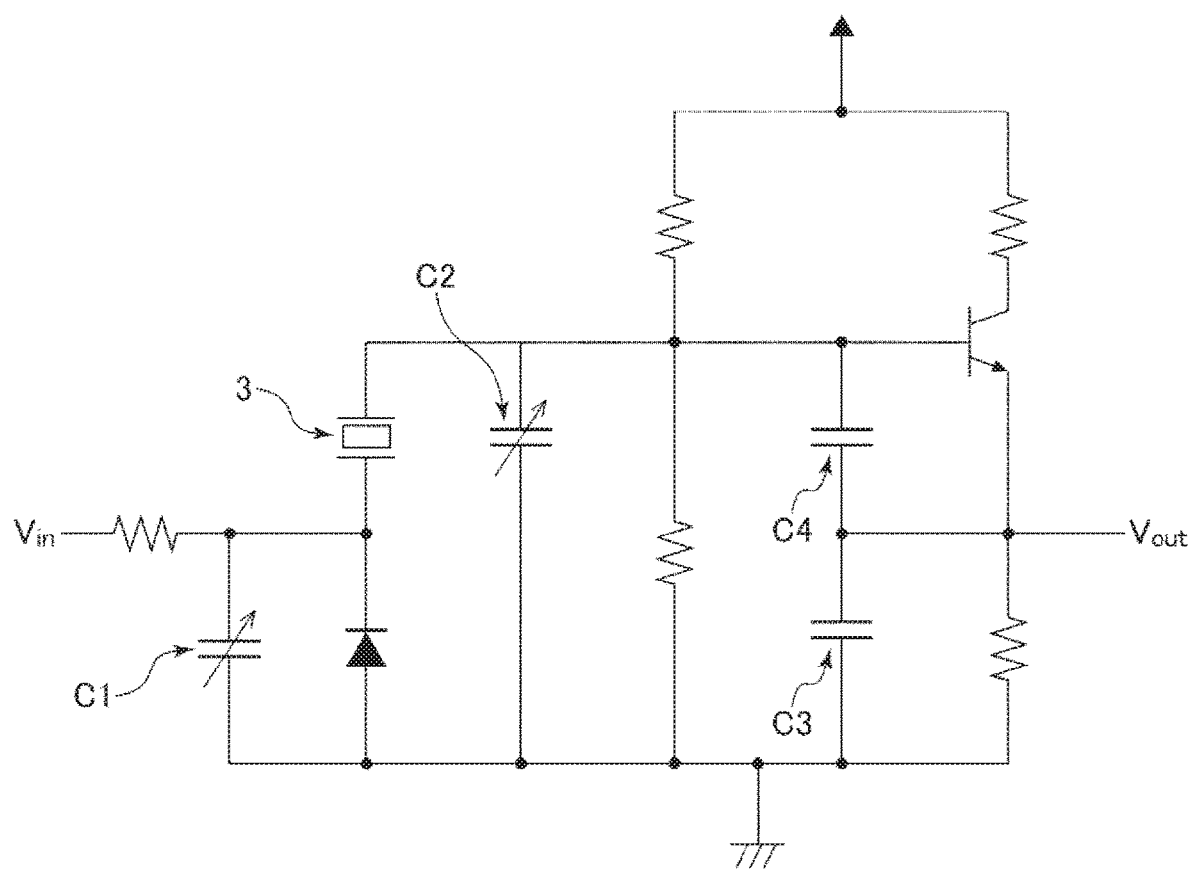
FIG. 2 is a circuit diagram showing an oscillation circuit provided to an integrated circuit.
Figure 3:
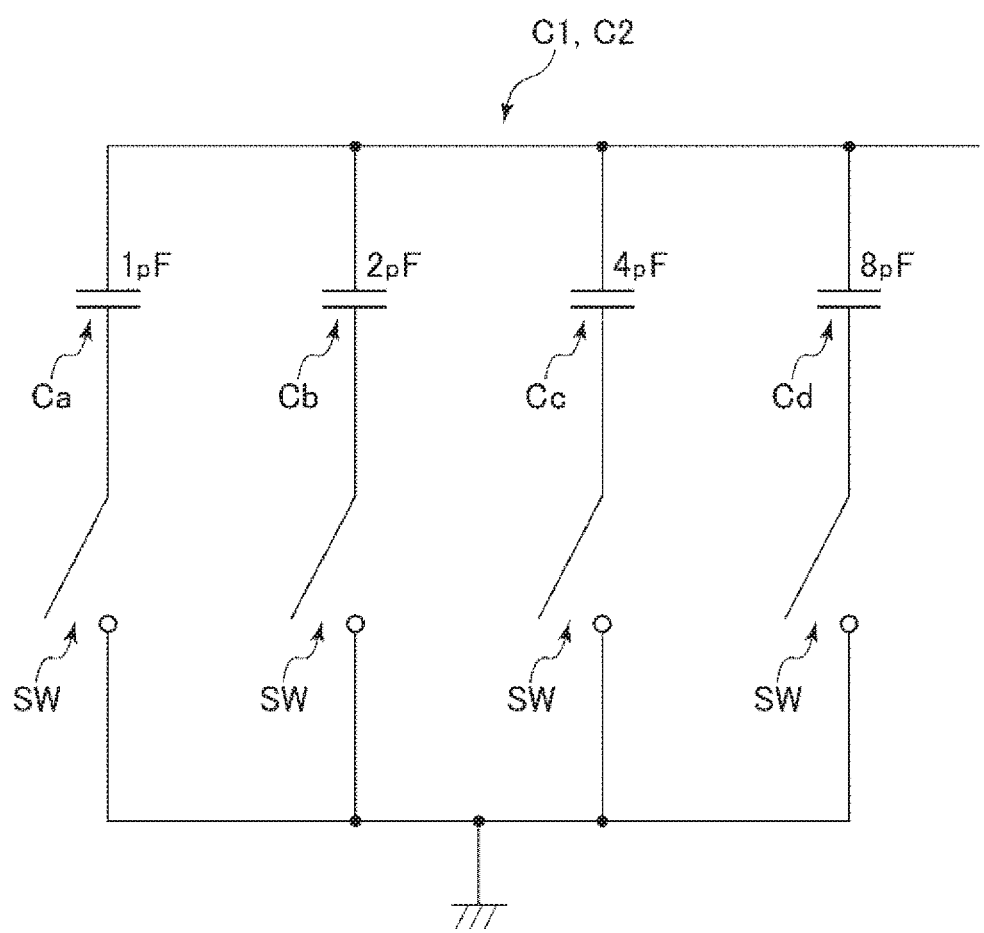
FIG. 3 is a circuit diagram showing an example of a variable capacitance-type capacitor provided to the oscillation circuit shown in FIG. 2.
Figure 4:
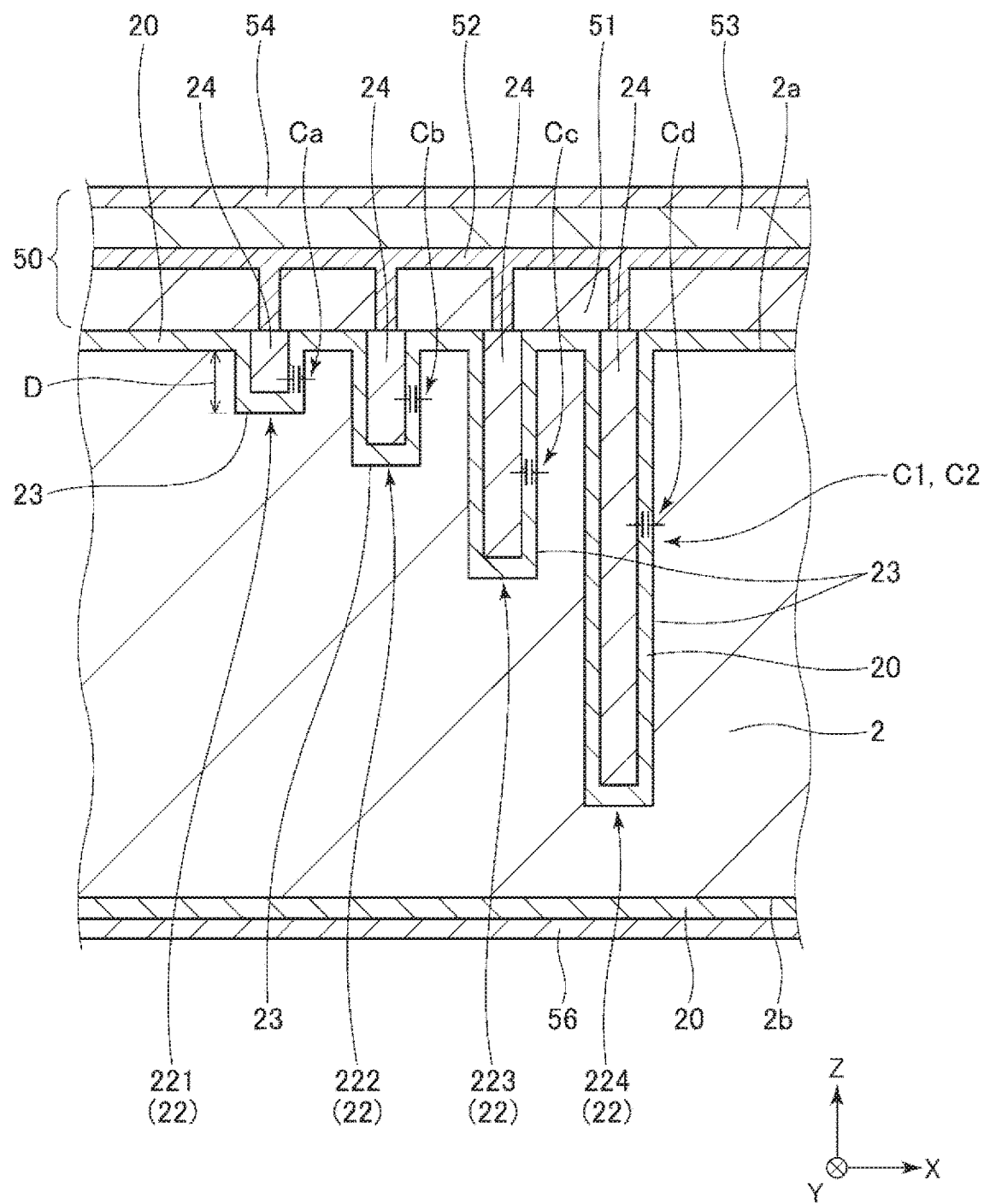
FIG. 4 is a cross-sectional view showing a configuration of a capacitor.
Figure 5:
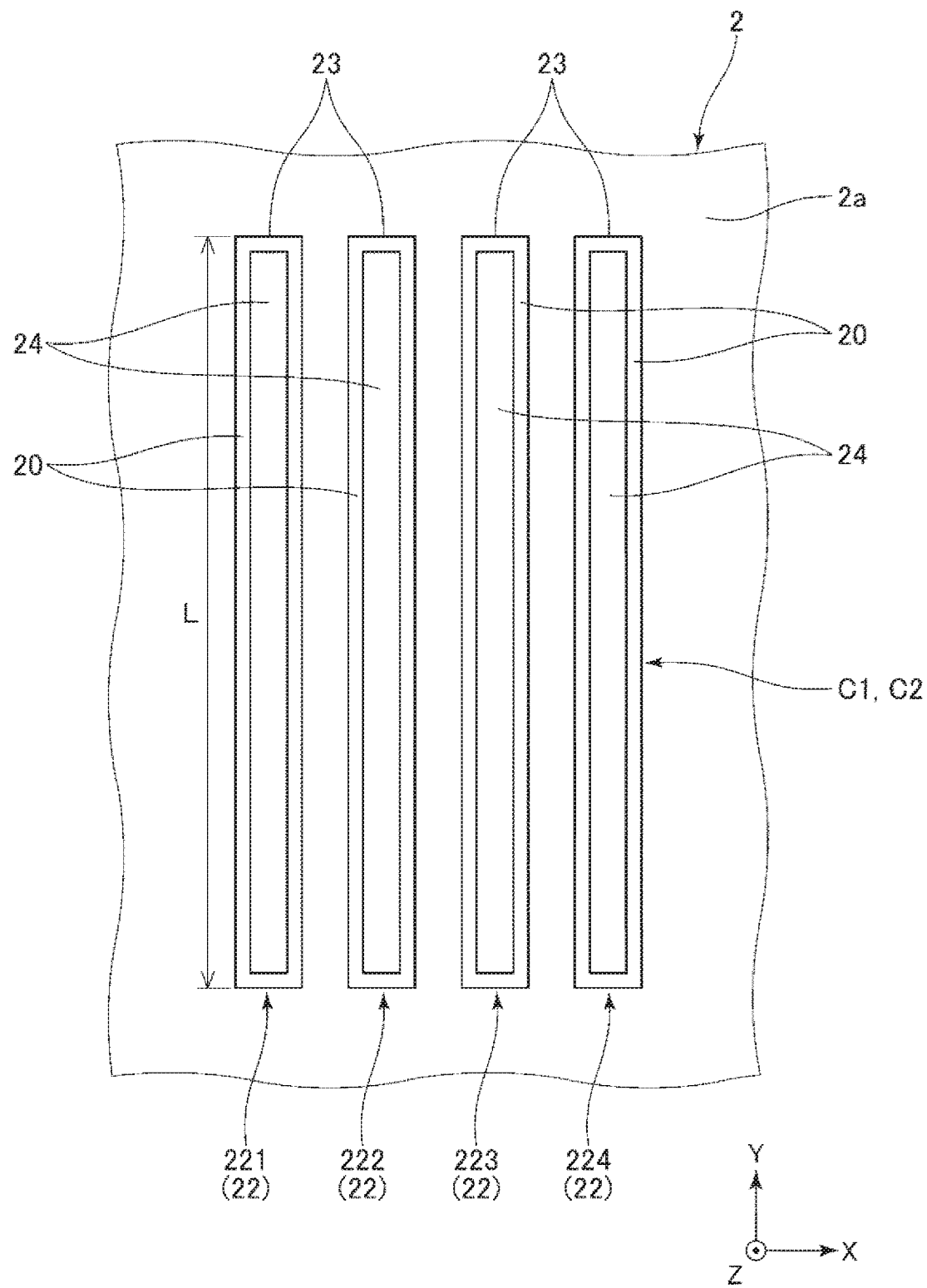
FIG. 5 is a plan view of the capacitor shown in FIG. 4.
Figure 7:
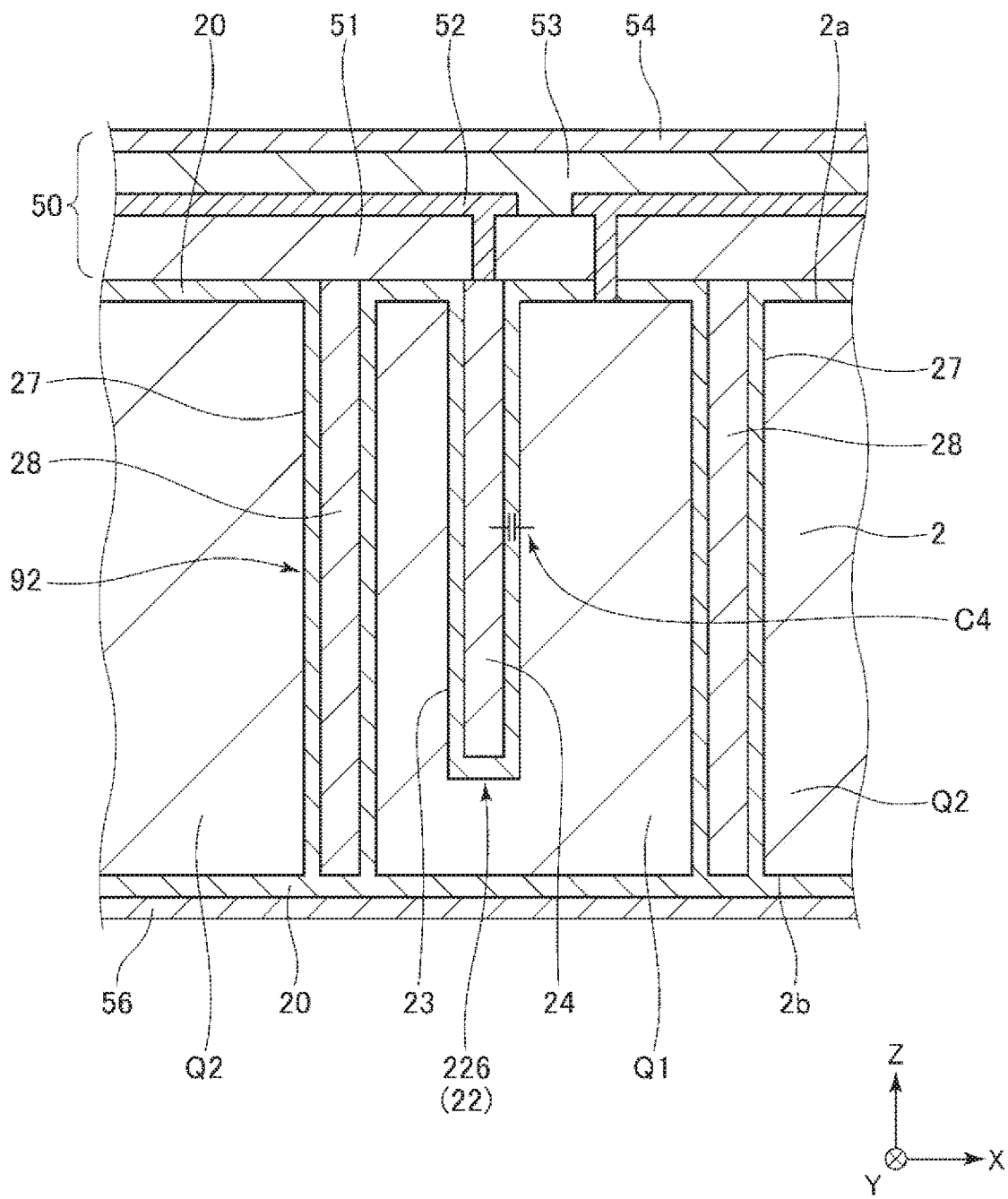
FIG. 7 is a cross-sectional view showing a configuration of a capacitor.
Figure 8:
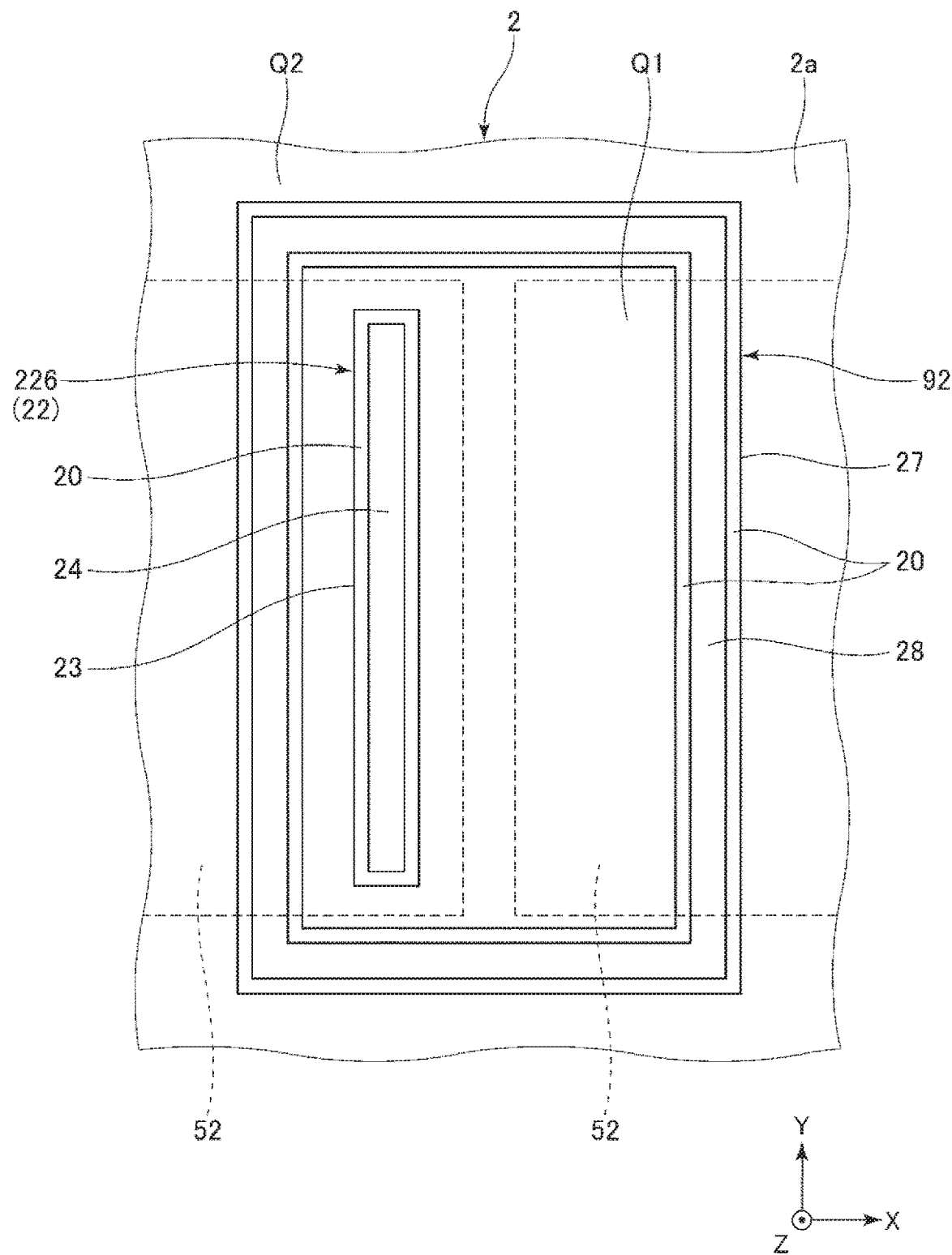
FIG. 8 is a plan view of the capacitor shown in FIG. 7.
Figure 9:
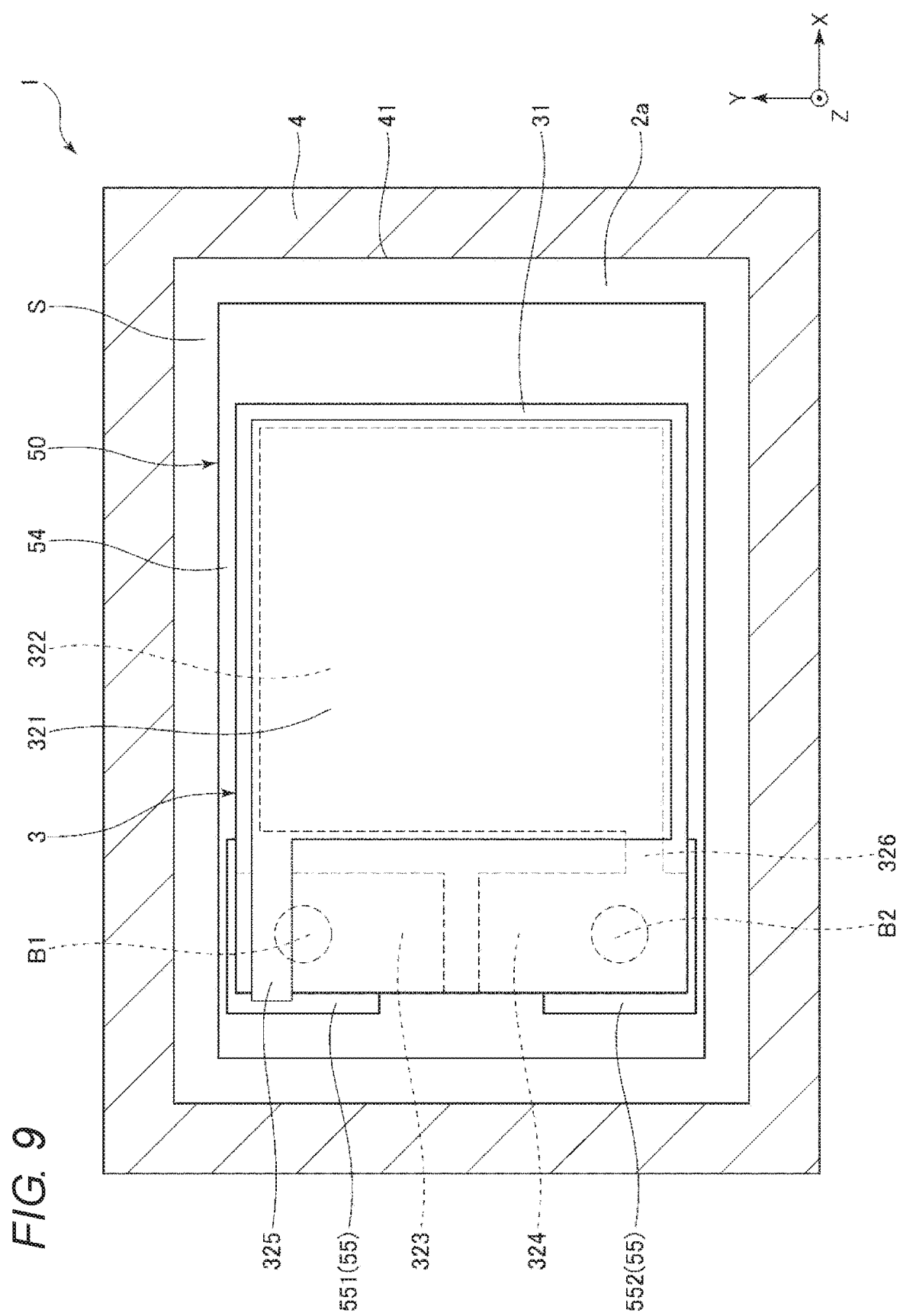
FIG. 9 is a plan view showing a vibration element.

FIG. 1 is a cross-sectional view showing the vibration device according to a first embodiment. FIG. 2 is a circuit diagram showing an oscillation circuit provided to an integrated circuit. FIG. 3 is a circuit diagram showing an example of a variable capacitance-type capacitor provided to the oscillation circuit shown in FIG. 2. FIG. 4 is a cross-sectional view showing a configuration of a capacitor. FIG. 5 is a plan view of the capacitor shown in FIG. 4. FIG. and FIG. 7 are each a cross-sectional view showing a configuration of a capacitor. FIG. 8 is a plan view of the capacitor shown in FIG. 7. FIG. 9 is a plan view showing a vibration element. It should be noted that in each of the drawings except FIG. 2 and FIG. 3, there are illustrated three axes perpendicular to each other as an X axis, a Y axis, and a Z axis for the sake of convenience of explanation. Further, the side to which the arrow in the Z-axis direction points is also referred to as an "upper side," and the opposite side is also referred to as a "lower side." Further, a plan view viewed from the Z-axis direction is also referred to simply as a "plan view." Further, in the following description, the expression "forming something on an upper surface" includes when forming something at a position a predetermined distance distant from the upper surface, namely when "forming something at the upper surface side" in addition to when forming something directly on the upper surface. The same applies to the lower surface. Further, in the following description, the expression "disposing something on an upper surface" includes when forming something at a position a predetermined distance distant from the upper surface, namely when "forming something at the upper surface side" in addition to when forming something directly on the upper surface. The same applies to the lower surface.

The vibration device 1 shown in FIG. 1 has a base substrate 2, a vibration element 3 disposed on an upper surface of the base substrate 2, and a lid 4 bonded to the upper surface of the base substrate 2 so as to cover the vibration element 3.

The base substrate 2 is a silicon substrate as a semiconductor substrate, and the thickness direction is set in the Z-axis direction. It should be noted that the base substrate 2 is not particularly limited, and it is possible to use a semiconductor substrate other than silicon such as a semiconductor substrate made of, for example, Ge, Gap, GaAs, or InP.

Further, the base substrate 2 has the upper surface 2a as a first surface and a lower surface 2b as a second surface, wherein the first surface and the second surface are in an obverse-reverse relationship, and the surface of the base substrate 2 is covered with an insulating film 20 made of silicon oxide ($SiO_2$). It should be noted that the constituent material of the insulating film 20 is not particularly limited, but can be formed of, for example, silicon nitride (SiN). Further, on the upper surface 2a, there is formed an integrated circuit 5 electrically coupled to the vibration element 3. The integrated circuit 5 has an element separation area T1 and an activation area T2 surrounded by the element separation area T1, and in the activation area T2, there is formed an active element not shown such as a transistor. By providing the integrated circuit 5 to the base substrate 2, it is possible to effectively using a space in the base substrate 2. In particular, by forming the integrated circuit 5 on the upper surface 2a, it is possible to dispose the integrated circuit 5 within a housing space S described later, and thus, it is possible to protect the integrated circuit 5 from an external environment.

It should be noted that the integrated circuit 5 is not particularly limited, and there can be cited, for example, a temperature-compensated oscillator for oscillating the vibration element 3 to generate the frequency of a reference signal such as a clock signal as shown in FIG. 2. It should be noted that the reference Vin shown in FIG. 2 denotes a temperature compensation voltage, and the reference Vout denotes an oscillation signal.

Further, as shown in FIG. 1, on the supper surface 2a of the base substrate 2, there is disposed a stacked body 50 having an insulating layer 51, a wiring layer 52, an insulating layer 53, a passivation film 54, and a terminal layer 55 stacked on one another, a plurality of active elements (not shown) formed on the upper surface 2a is electrically coupled, and thus the integrated circuit 5 is constituted. The terminal layer 55 includes a pair of terminals 551, 552 which are electrically coupled to the wiring layer 52, and are for achieving electrical coupling to the vibration element 3. It should be noted that although there is assumed the configuration in which the single wiring layer 52 is included in the stacked body 50 for the sake of convenience of explanation, this is not a limitation, and it is possible to stack two or more wiring layers 52 stacked on one another via the insulating layers 53. In other words, it is possible to alternately stack the wiring layer 52 and the insulating layer 53 a plurality of times between the insulating layer 51 and the passivation film 54.

Further, on the lower surface 2b of the base substrate 2, there is disposed a plurality of terminals 56. These terminal 56 function as external coupling terminals for achieving electrical coupling to external electronic equipment such as a circuit board. The plurality of terminals 56 includes, for example, a terminal coupled to a substrate potential, a terminal coupled to a power supply of the integrated circuit 5, and a terminal from which an oscillation signal from the integrated circuit 5 is output. It should be noted that the number and the usage of the terminals 56 are not particularly limited, but can arbitrarily set in accordance with the configuration of the integrated circuit 5. When the base substrate 2 is a P-type silicon substrate having the P-type conductivity, the substrate potential becomes the ground, and on the contrary, when the base substrate 2 is an N-type silicon substrate having the N-type conductivity, the substrate potential becomes the power supply voltage. It should be noted that in the present embodiment, the base substrate 2 is formed of the P-type silicon substrate.

Further, each of the terminals 56 is electrically coupled to the integrated circuit 5 via the through electrode 57 penetrating the base substrate 2 in the thickness direction. The through electrode 57 for the substrate potential is electrically coupled to an area for supplying the substrate potential via the wiring layer 52, and the through electrodes for the power supply and the oscillation signal are electrically coupled to the active elements inside the activation area T2 via the wiring layer 52. These through electrodes 57 are each formed by filling a hole 21 which penetrates the base substrate 2 in the thickness direction, and is provided with the insulating film 20 formed on the inside wall with an electrically-conductive material. The electrically-conductive material is not particularly limited, but in the present embodiment, there is used electrically-conductive polysilicon. The electrically-conductive polysilicon means polysilicon doped with an impurity such as phosphorus (P), boron (B), or arsenic (As) to thereby be provided with electrical conductivity. It should be noted that the electrically-conductive material is not particularly limited, and there can be used a metal material excellent in heat resistance such as tungsten (W).

Further, each of the through electrodes 57 is formed so as not to overlap the element separation area T1 in the plan view, but to overlap the activation area T2.

Further, the base substrate 2 is provided with a plurality of capacitance forming sections 22. It should be noted that in FIG. 1, there is illustrated a single capacitance forming section 22 alone. The plurality of capacitors 22 is represented as capacitors C1, C2, C3, and C4 in the oscillation circuit shown in FIG. 2. Out of the capacitors C1, C2, C3, and C4, the capacitors C1, C2 are capacitors for adjusting the frequency of the oscillation signal. Since the capacitors C1, C2 are provided, it is possible to accurately adjust the frequency of the oscillation signal to a desired frequency.

Each of the capacitance forming sections 22 has a recess 23 as a bottomed recess having the depth direction in the Z-axis direction and opening in the upper surface 2a of the base substrate 2, the insulating film 20 disposed on the inside wall of the recess 23, and an electrically-conductive part 24 which is made of an electrically-conductive material, and fills the recess 23. The electrically-conductive material is not particularly limited, but in the present embodiment, there is used electrically-conductive polysilicon. The electrically-conductive polysilicon means polysilicon doped with an impurity such as phosphorus (P), boron (B), or arsenic (As) to thereby be provided with electrical conductivity. It should be noted that the electrically-conductive material is not particularly limited, and there can be used a metal material excellent in heat resistance such as tungsten (W).

In other words, each of the capacitance forming sections 22 is substantially the same in configuration as the through electrode 57. Therefore, it is possible to form the capacitance forming sections 22 and the through electrodes 57 in a lump, and thus, the complication of the manufacturing of the vibration device 1 is prevented.

In each of such capacitance forming sections 22, the capacitance of each of the capacitors C1, C2, C3, and C4 is formed by sandwiching the insulating film 20 with the electrically-conductive part 24 and the base substrate 2. It should be noted that each of the capacitance forming sections 22 is formed so as not to overlap the element separation area T1 in the plan view, but to overlap the activation area T2.

As described above, the recess 23 of each of the capacitance forming sections 22 is the bottomed recess, and therefore, does not open in the lower surface 2b of the base substrate 2. Therefore, the electrically-conductive part 24 inside the recess 23 does not have contact with the terminal 56 on the lower surface 2b. In other words, each of the capacitance forming sections 22 is not used for electrically coupling the terminal 56 and the integrated circuit 5 to each other to supply the integrated circuit 5 with the power or the substrate potential, or to take out the oscillation signal from the integrated circuit 5 through the terminal 56. Thus, the degree of design freedom of the capacitance forming sections 22 increases, and it becomes easy to form the capacitors C1 through C4 having the desired capacitances. It should be noted that the configuration of the plurality of capacitance forming sections is not particularly limited, and for example, the recess 23 of at least one of the capacitance forming sections 22 can open in the lower surface 2b. In other words, it is possible for the recess 23 of at least one of the capacitance forming sections 22 to be formed of a through hole penetrating the base substrate 2 in the thickness direction. Also in this case, the non-contact state between the electrically-conductive part 24 and the terminal 56 can be ensured by the insulating film 20 disposed on the lower surface 2b.

In a general integrated circuit, the capacitors C1, C2, C3, and C4 are formed between the pair of wiring layers 52 stacked in the stacked body 50 and the insulating layer 53 intervening there between. However, in this configuration, the number of the wiring layers 52 stacked increases to make the integrated circuit thicker. In contrast, by forming the capacitors C1, C2, C3, and C4 in the base substrate 2, it is possible to reduce the number of the wiring layers 52 in the stacked body 50, and accordingly, it is possible to make the integrated circuit 5 thinner. Further, a space where the capacitors C1, C2, C3, and C4 can be formed is sufficiently prepared in the base substrate 2. Therefore, it is possible to form the capacitors C1, C2, C3, and C4 having the necessary capacitances without being accompanied by the growth in side of the base substrate 2. Further, the capacitance forming sections 22 in the present embodiment are each substantially the same in configuration as the through electrode 57. Therefore, it is possible to form the capacitance forming sections 22 and the through electrodes 57 in a lump, and thus, the complication of the manufacturing of the vibration device 1 is prevented.

Out of these capacitors C1, C2, C3, and C4, the capacitors C1, C2 are each a variable capacitance-type capacitor, and one end thereof is coupled to the ground as the substrate potential. As shown in FIG. 3, each of the capacitors C1, C2 has a plurality of capacitors different in capacitance from each other coupled in parallel to each other, and is arranged to be able to change the capacitance by arbitrarily selecting the coupling state of these capacitors with switching elements SW. According to such a configuration, it is possible to more accurately adjust the frequency of the oscillation signal. In particular, in the present embodiment, the capacitors C1, C2 each have a configuration in which a first capacitor Ca having a first capacitance of 1 pF, a second capacitor Cb having a second capacitance of 2 pF, a third capacitor Cc having a third capacitance of 4 pF, and a fourth capacitor Cd having a capacitance of 8 pF are coupled in parallel to each other. It should be noted that the number and capacitances of the capacitors included in each of the capacitors C1, C2 are not particularly limited.

Further, as shown in FIG. 4, in the plurality of capacitance forming sections 22 provided to the base substrate 2, there are included a capacitance forming section 221 for forming the first capacitor Ca, a capacitance forming section 222 for forming the second capacitor Cb, a capacitance forming section 223 for forming the third capacitor Cc, and a capacitance forming section 224 for forming the fourth capacitor Cd, and the electrically-conductive parts 24 of these capacitance forming sections 221 through 224 are electrically coupled to each other via the wiring layer 52. Further, by setting each of the electrically-conductive parts 24 to the desired potential, the first through fourth capacitors Ca through Cd are formed with the base substrate 2 coupled to the ground.

Further, the capacitance forming sections 221 through 224 are different in opposed area between the electrically-conductive part 24 and the base substrate 2 from each other. By making the opposed areas different from each other as described above, it is possible to provide the first through fourth capacitors Ca through Cd with the desired capacitances. In particular, in the present embodiment, the capacitance forming sections 221 through 224 are different in depth D of the recess 23 from each other. By controlling the depth D in such a manner, it is possible to adjust the opposed area between the electrically-conductive part 24 and the base substrate 2. According to the method of adjusting the opposed area, namely the capacitance, using the depth D of the recess 23, it is possible to accurately and easily adjust the capacitance. In the present embodiment, since the capacitances of the first through fourth capacitors Ca through Cd fulfill Ca<Cb<Cc<Cd, when defining the recesses 23 of the first through fourth capacitors Ca through Cd as recesses 23a through 23d, and the depths thereof as Da, Db, Dc, and Dd, Da<Db<Dc<Dd is fulfilled.

Further, as shown in FIG. 5, in each of the capacitance forming sections 221 through 224, the length along the Y axis is longer than the length along the X axis in a plan view. In particular, in the present embodiment, the capacitance forming sections 221 through 224 each have a rectangular shape. According to such a shape, it is possible to make the opposed area between the electrically-conductive part 24 and the base substrate 2 large while preventing the capacitance forming sections 221 through 224 from growing in size, and it is possible to form the capacitors C1, C2 having the sufficient capacitances in a smaller space in the base substrate 2. It should be noted that, as described above, in the present embodiment, since the capacitances of the first through fourth capacitors Ca through Cd are adjusted by making the recesses 23 different in depth D from each other, the capacitance forming sections 221 through 224 are made equal in length L in the Y-axis direction to each other.

It should be noted that the configuration of the capacitance forming sections 221 through 224 is not particularly limited. For example, at least one of the capacitance forming sections 221 through 224 can be bent or curved in the middle, or can change in width in the middle. Further, at least one of the capacitance forming sections 221 through 224 can be different in length L. Further, at least one of the capacitance forming sections 221 through 224 can have a longitudinal shape extending in a direction different from the Y-axis direction such as the X-axis direction or a direction tilted with respect to both of the X axis and the Y axis. Further, at least one of the capacitance forming sections 221 through 224 can have a shape other than the longitudinal shape such as a square shape, a circular shape, or an odd shape.

Figure 6:
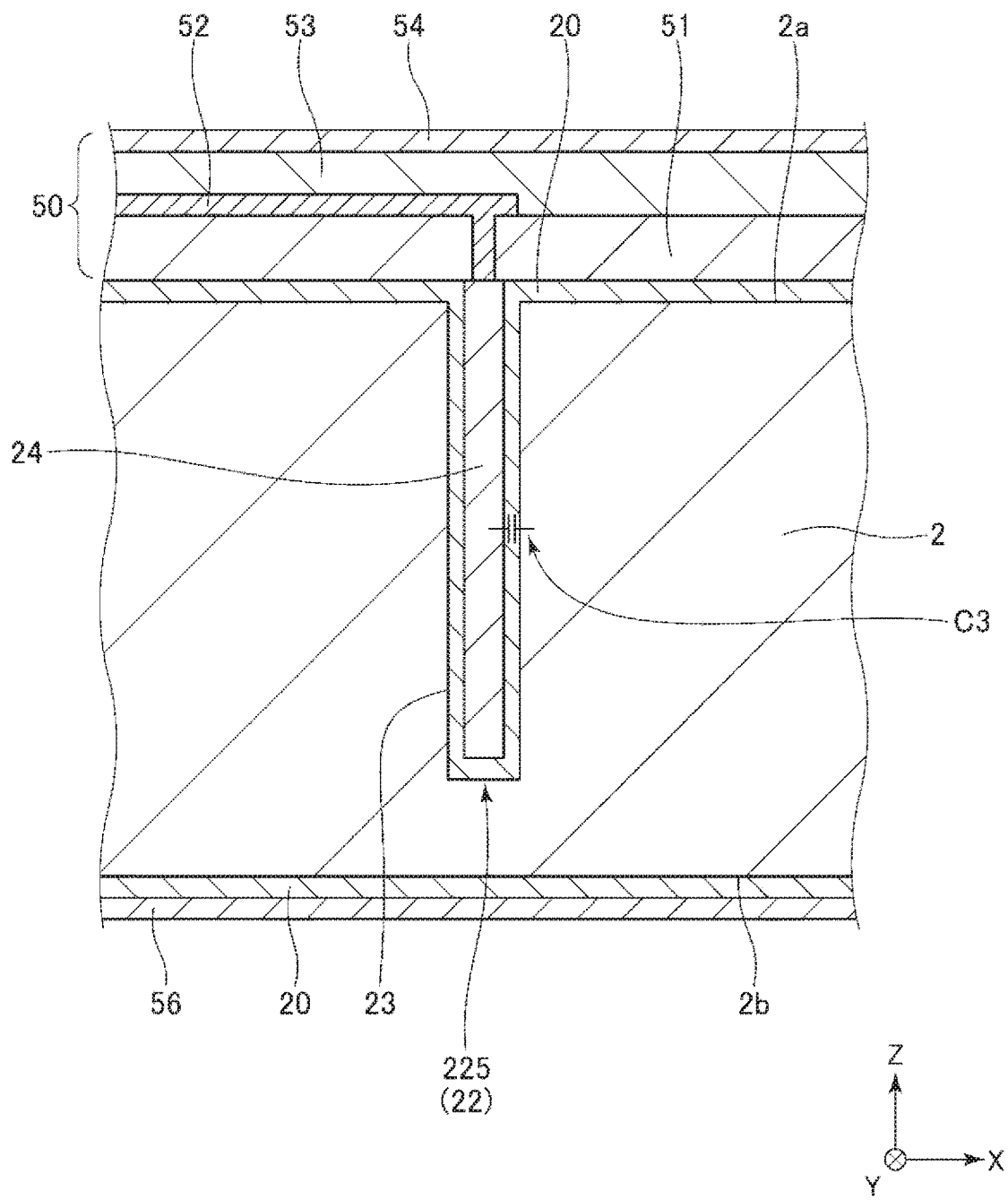
FIG. 6 is a cross-sectional view showing a configuration of a capacitor.

Further, the capacitor C3 is a fixed capacitance-type capacitor, and one end thereof is coupled to the ground as the substrate potential. As shown in FIG. 6, the plurality of capacitance forming sections 22 provided to the base substrate 2 includes a capacitance forming section 225 for forming the capacitor C3, and the electrically-conductive part 24 of the capacitance forming section 225 is electrically coupled to the wiring layer 52. Further, by setting the electrically-conductive part 24 to the desired potential, the capacitor C3 is formed with the base substrate 2 coupled to the ground. Although not shown in the drawings, similarly to the capacitance forming sections 221 through 224, the capacitance forming section 225 also has a rectangular shape as the longitudinal shape along the Y-axis direction.

Further, the capacitor C4 is a fixed capacitance-type capacitor, and one end thereof is coupled to the capacitor C3. As shown in FIG. 7, the plurality of capacitance forming sections 22 provided to the base substrate 2 includes a capacitance forming section 226 for forming the capacitor C4, and the electrically-conductive part 24 of the capacitance forming section 226 is electrically coupled to the wiring layer 52. Further, by setting the electrically-conductive part 24 to the desired potential, the capacitor C4 is formed with the base substrate 2. Here, unlike the capacitors C1 through C3 described above, the capacitor C4 is coupled to the capacitor C3 in one end, and has a potential different from the ground as the substrate potential. Therefore, the capacitance forming section 226 is provided with the following device.

As shown in FIG. 7 and FIG. 8, the base substrate 2 is provided with a frame 92 having an insulating property shaped like a frame in a plan view from the Z-axis direction and penetrating the base substrate 2 in the thickness direction. The frame 92 insulates an area Q1 inside the frame 92 and an area Q2 outside the frame 92 from each other in the inside of the base substrate 2. Further, the capacitance forming section 226 is disposed inside the frame 92. According to such a configuration, since the area Q1 inside the frame 92 is electrically separated from the area Q2 outside the frame 92, it is possible to couple the area Q1 to a different potential from the substrate potential. In the present embodiment, the wiring layer 52 is coupled to the area Q1, and the area Q1 is coupled to the potential other than the substrate potential via the wiring layer 52. Thus, the capacitor C4 is formed between the electrically-conductive part 24 of the capacitance forming section 226 and the area Q1.

The frame 92 has a hole 27 penetrating the base substrate 2 in the thickness direction, the insulating film disposed on the inside wall of the hole 27, and an electrically-conductive part 28 made of an electrically-conductive material filling the hole 27. The electrically-conductive material is not particularly limited, but in the present embodiment, there is used electrically-conductive polysilicon. The electrically-conductive polysilicon means polysilicon doped with an impurity such as phosphorus (P), boron (B), or arsenic (As) to thereby be provided with electrical conductivity. It should be noted that the electrically-conductive material is not particularly limited, and there can be used a metal material excellent in heat resistance such as tungsten (W).

In other words, the frame 92 is substantially the same in configuration as the through electrode 57. Therefore, it is possible to form the frame 92 and the through electrodes 57 in a lump, and thus, the complication of the manufacturing of the vibration device 1 is prevented. It should be noted that the configuration of the frame 92 is not particularly limited providing the frame 92 can insulate the areas Q1, Q2 from each other. For example, it is possible to fill the hole with an insulating material instead of the electrically-conductive material. Further, it is also possible to fill the hole 27 with the insulating film 20 alone without filling the hole 27 with the electrically-conductive material.

As shown in FIG. 1, the lid 4 is a silicon substrate similarly to the base substrate 2. Thus, the base substrate 2 and the lid 4 becomes equal in linear expansion coefficient to each other to prevent the thermal stress caused by the thermal expansion from occurring, and thus, the vibration device 1 having the excellent vibration characteristics is obtained. Further, since it is possible to form the vibration device 1 with the semiconductor process, the vibration device 1 can accurately be manufactured, and at the same time, it is possible to achieve reduction in size thereof. It should be noted that the lid 4 is not particularly limited, and it is possible to use a semiconductor substrate other than silicon such as a semiconductor substrate made of, for example, Ge, Gap, GaAs, or InP.

The lid 4 has a recess 41 as a bottomed recess which opens in the lower surface of the lid 4, and houses the vibration element 3 inside. Further, the lower surface of the lid 4 is bonded to the upper surface 2a of the base substrate 2 via a bonding member 6. Thus, the housing space S for housing the vibration element 3 is formed between the lid 4 and the base substrate 2. The housing space S is airtightly sealed, and is set in a reduced-pressure state, and more preferably, in a state approximate to a vacuum state. Thus, the vibration characteristics of the vibration element 3 are improved. It should be noted that the atmosphere in the housing space S is not particularly limited, but can be an atmosphere filled with an inert gas such as nitrogen or Ar, or can be in the atmospheric pressure state or a pressurized state instead of the reduced-pressure state.

As shown in FIG. 9, the vibration element 3 has a vibration substrate 31 and electrodes disposed on a surface of the vibration substrate 31. The vibration substrate 31 has a thickness-shear vibration mode, and is formed of an AT-cut quartz crystal substrate in the present embodiment. Since the AT-cut quartz crystal substrate has the third-order frequency-temperature characteristic, the vibration element 3 having the excellent temperature characteristic is obtained. Further, the electrodes include an excitation electrode 321 disposed on an upper surface of the vibration substrate 31, and an excitation electrode 322 disposed on a lower surface so as to be opposed to the excitation electrode 321. Further, the electrodes include a pair of terminals 323, 324 disposed on the lower surface of the vibration substrate 31, an interconnection 325 for electrically coupling the terminal 323 and the excitation electrode 321 to each other, and an interconnection 326 for electrically coupling the terminal 324 and the excitation electrode 322 to each other.

It should be noted that the configuration of the vibration element 3 is not limited to the configuration described above. For example, the vibration element 3 can be provided with a mesa structure in which a vibration area sandwiched between the excitation electrodes 321, 322 protrudes from the periphery of the vibration area, or can also be provided with an inverted-mesa structure in which the vibration area is recessed from the periphery of the vibration area, on the contrary. Further, it is also possible to perform a bevel treatment for grinding the periphery of the vibration substrate 31, or a convex treatment for changing the upper surface and the lower surface to a convex surface.

Further, the vibration element 3 is not limited to one vibrating in the thickness-shear vibration mode, and can be, for example, a vibration element having a plurality of vibrating arms making a flexural vibration in an in-plane direction. In other words, the vibration substrate 31 is not limited to one formed of the AT-cut quartz crystal substrate, and can also be formed of a quartz crystal substrate other than the AT-cut quartz crystal substrate such as an X-cut quartz crystal substrate, a Y-cut quartz crystal substrate, a Z-cut quartz crystal substrate, a BT-cut quartz crystal substrate, an SC-cut quartz crystal substrate, or an ST-cut quartz crystal substrate. Further, the vibration substrate 31 is formed of the quartz crystal in the present embodiment, but this is not a limitation, and it is possible for the vibration substrate 31 to be formed of a piezoelectric single-crystal body made of, for example, lithium niobate, lithium tantalate, lithium tetraborate, langasite, potassium niobate, or gallium phosphate, or to be formed of another piezoelectric single-crystal body than these. Furthermore, the vibration element 3 is not limited to the piezoelectrically-actuated vibration element, but can be an electrostatically-actuated vibration element using electrostatic force.

Such a vibration element 3 is fixed to the upper surface 2a of the base substrate 2, more specifically, to the upper surface of the stacked body 50, with bonding members B1, B2 having electrical conductivity. Further, the bonding member B1 electrically couples the terminal 551 provided to the stacked body 50 and the terminal 323 provided to the vibration element 3 to each other, and the bonding member B2 electrically couples the terminal 552 provided to the stacked body 50 and the terminal 324 provided to the vibration element 3 to each other. Thus, the vibration element 3 and the integrated circuit 5 are electrically coupled to each other.

The bonding members B1, B2 are not particularly limited as long as both of the electrical conductivity and the bonding property are provided, and it is possible to use, for example, a variety of metal bumps such as gold bumps, silver bumps, copper bumps, or solder bumps, or an electrically conductive adhesive having an electrically conductive filler such as a silver filler dispersed in a variety of adhesives such as a polyimide type adhesive, an epoxy type adhesive, a silicone type adhesive, or an acrylic adhesive. When using the metal bumps which are in the former group as the bonding members B1, B2, it is possible to suppress generation of a gas from the bonding members B1, B2, and it is possible to effectively prevent a change in environment, in particular rise in pressure, of the housing space S. On the other hand, when using the electrically conductive adhesive which is in the latter group as the bonding members B1, B2, the bonding members B1, B2 become soft compared to the metal bumps, and it becomes difficult for a stress to reach the vibration element 3.

The vibration device 1 is hereinabove described. As described above, such a vibration device 1 has the base substrate 2 as the semiconductor substrate having the upper surface 2a as the first surface and the lower surface 2b as the second surface, wherein the first surface and the second surface are in the obverse-reverse relationship, the vibration element 3 disposed on the upper surface 2a, the lid 4 as the lid bonded to the upper surface 2a, the integrated circuit 5 disposed on the upper surface 2a, the terminals 56 disposed on the lower surface 2b, the through electrodes 57 penetrating the base substrate 2 to electrically couple the terminals 56 and the integrated circuit 5 to each other, and the first capacitor Ca. The capacitance forming section 221 forming the first capacitor Ca is provided with the recess 23 as the first recess provided to the base substrate 2 and opening in the upper surface 2a, the insulating film 20 disposed on the inside surface of the recess 23, and the electrically-conductive part 24 as the electrically-conductive material filling the recess 23, and has the first capacitance between the electrically-conductive part 24 and the base substrate 2. Further, the electrically-conductive part 24 does not have contact with the terminal 56 on the lower surface 2b side.

In other words, the capacitance forming section 221 is not used for electrically coupling the terminal 56 and the integrated circuit 5 to each other to supply the integrated circuit 5 with the power or the substrate potential, or to take out the oscillation signal from the integrated circuit 5 through the terminal 56. Thus, the degree of design freedom of the capacitance forming section 221 increases, and it becomes easy to form the first capacitor Ca having the desired capacitance. Further, by forming the first capacitor Ca in the base substrate 2, it is possible to reduce the number of the wiring layers 52 in the stacked body 50, and accordingly, it is possible to make the integrated circuit 5 thinner. Further, the space where the first capacitor Ca can be formed is sufficiently prepared in the base substrate 2. Therefore, it is possible to form the first capacitor Ca having the necessary capacitance without being accompanied by the growth in side of the base substrate 2. Further, since the capacitance forming section 221 is substantially the same in configuration as the through electrode 57, it is possible to form the capacitance forming section 221 and the through electrodes 57 in a lump, and thus, the complication of the manufacturing of the vibration device 1 is prevented.

Further, as described above, the integrated circuit includes the oscillation circuit for oscillating the vibration element 3 to output the oscillation signal, and the first capacitor Ca is used for adjusting the frequency of the oscillation signal. As described above, by forming the capacitors C1, C2 for adjusting the frequency using the capacitance forming sections 22, it becomes easy to make the capacitors C1, C2 have the desired capacitances, and thus, it is possible to more accurately adjust the frequency of the oscillation signal.

Further, as described above, the vibration device 1 has the second capacitor Cb which is provided with the recess 23 as the second recess provided to the base substrate 2 and opening in the upper surface 2a, the insulating film 20 disposed on the inside surface of the recess 23, and the electrically-conductive part 24 as the electrically-conductive material filling the recess 23, and has the second capacitance different from the first capacitance between the electrically-conductive part 24 and the base substrate 2. According to such a configuration, by selecting the coupling state of the first and second capacitors Ca, Cb, it is possible to obtain the capacitors C1, C2 each having a variety of capacitances. Therefore, it is possible to more accurately adjust the frequency of the oscillation signal.

Further, as described above, the opposed area between the second capacitor Cb and the base substrate 2 is different from the opposed area between the first capacitor Ca and the base substrate 2. Thus, it is possible to more easily make the first and second capacitors Ca, Cb different in capacitance from each other.

Further, as described above, the depth D of the recess 23 of the second capacitor Cb is different from the depth D of the recess 23 of the first capacitor Ca. Thus, it is possible to more easily make the first and second capacitors Ca, Cb different in capacitance from each other.

Further, as described above, the vibration device 1 has the frame 92 which penetrates the base substrate 2 and has the insulating property, and the capacitance forming section 226 for forming the capacitor C4 is disposed inside the frame 92. Further, the area Q1 located inside the frame 92 of the base substrate 2 has the different potential from the substrate potential. According to such a configuration, it is possible to form the capacitor C4 to be coupled to the different potential from the substrate potential inside the base substrate 2. Therefore, it is possible to form, for example, the capacitor C4 in the oscillation circuit shown in FIG. 2 inside the base substrate 2.

Second Embodiment

Figure 10:
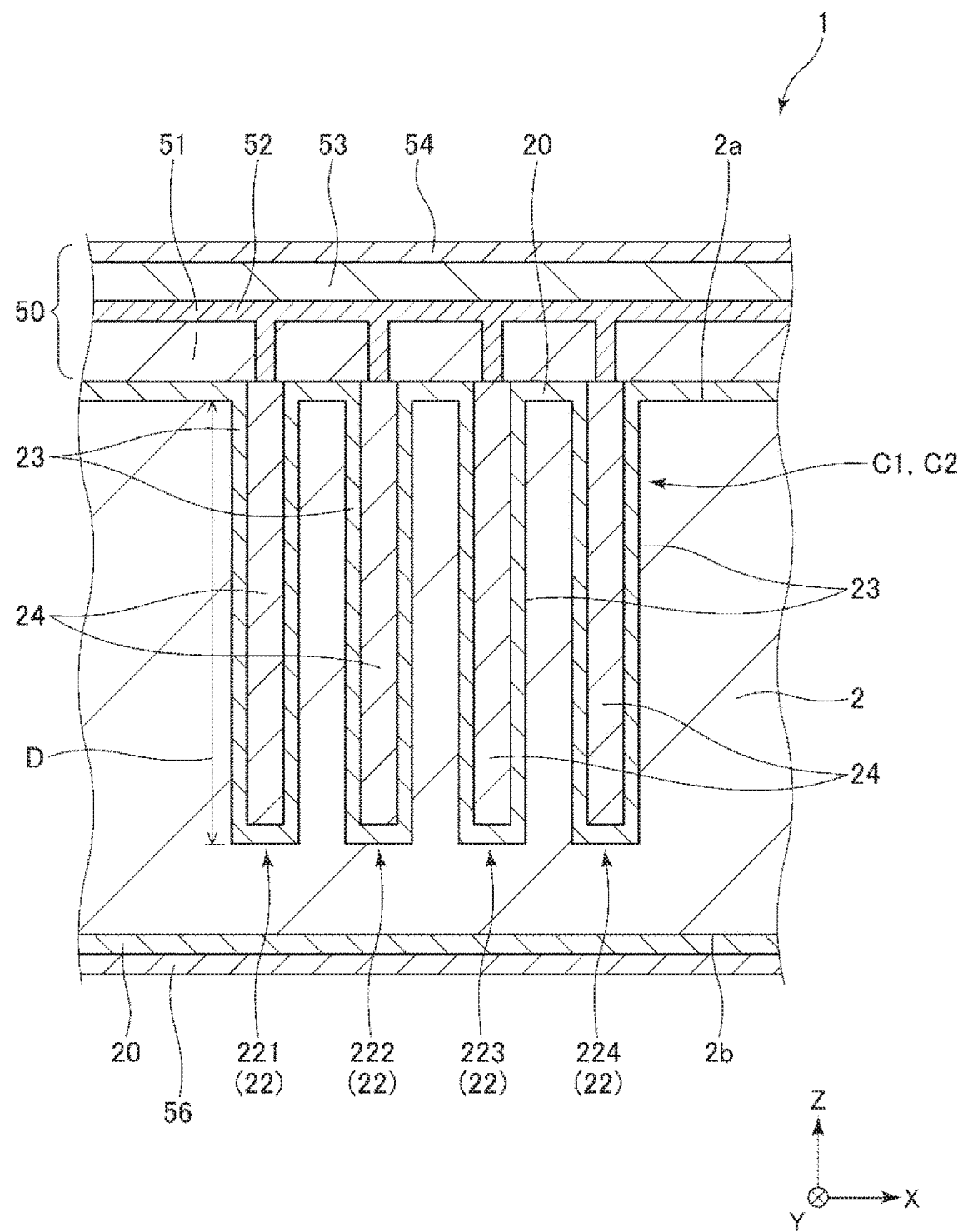
FIG. 10 is a cross-sectional view showing a capacitor provided to a vibration device according to a second embodiment.
Figure 11:
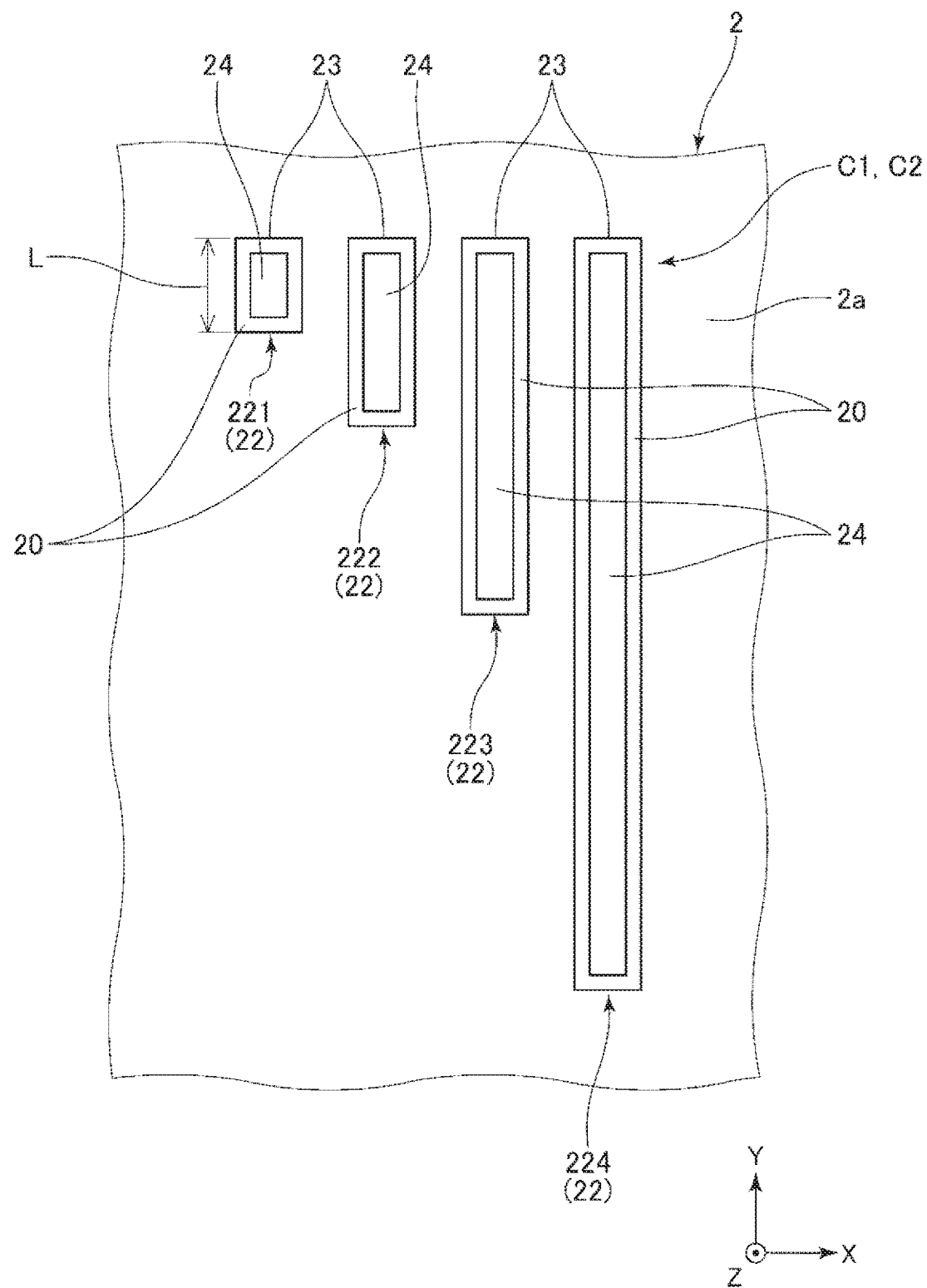
FIG. 11 is a plan view showing the capacitor shown in FIG. 10.

FIG. 10 is a cross-sectional view showing a capacitor provided to a vibration device according to a second embodiment. FIG. 11 is a plan view showing the capacitor shown in FIG. 10.

The vibration device 1 according to the present embodiment is substantially the same as the vibration device 1 according to the first embodiment described above except the point that the configuration of the capacitors C1, C2 is different. It should be noted that in the following description, the vibration device 1 according to the second embodiment will be described with a focus on the difference from the first embodiment described above, and the description of substantially the same issues will be omitted. Further, in FIG. 10 and FIG. 11, the constituents substantially identical to those of the embodiment described above are denoted by the same reference symbols.

Also in the capacitors C1, C2 in the present embodiment, similarly to the first embodiment described above, the capacitance forming sections 221 through 224 are different in opposed area between the electrically-conductive part 24 and the base substrate 2 from each other. It should be noted that in the present embodiment, the capacitance forming sections 221 through 224 are equal in depth D of the recess 23 to each other as shown in FIG. 10, and are different in length L in the Y-axis direction of the recess 23 from each other as shown in FIG. 11. Also by controlling the length L in such a manner, it is possible to adjust the opposed area between the electrically-conductive part 24 and the base substrate 2. According to the method of adjusting the opposed area, namely the capacitance, using the length L of the recess 23, it is possible to accurately and easily adjust the capacitance. In particular, since the planar space of the capacitors C1, C2 decreases compared to the first embodiment described above, it is possible to achieve the reduction in size of the vibration device 1. In the present embodiment, since the capacitances of the first through fourth capacitors Ca through Cd fulfill Ca<Cb<Cc<Cd, in the length of the recess 23, (capacitance forming section 221)<(capacitance forming section 222)<(capacitance forming section 223)< (capacitance forming section 224) is fulfilled.

As described hereinabove, in the vibration device 1 according to the present embodiment, the length L of the second capacitor Cb is different from the length L of the first capacitor Ca in the plan view of the base substrate 2. Thus, it is possible to more easily make the first and second capacitors Ca, Cb different in capacitance from each other.

According also to such a second embodiment described hereinabove, substantially the same advantages as in the first embodiment described above can be exerted.

Although the vibration device according to the present application example is described hereinabove based on the illustrated embodiments, the present application example is not limited to these embodiments, but the configuration of each of the components can be replaced with one having an identical function and an arbitrary configuration. Further, it is also possible to add any other constituents to the present application example. Further, the present application example can be a combination of any two or more configurations of the embodiments described above.

What is claimed is:

1. A vibration device comprising:
 a semiconductor substrate having a first surface and a second surface in an obverse-reverse relationship;
 a vibration element disposed on the first surface;
 a lid bonded to the first surface;
 an integrated circuit disposed on the first surface;
 a terminal disposed on the second surface;
 a through electrode which penetrates the semiconductor substrate, and is configured to electrically couple the terminal and the integrated circuit to each other; and
 a first capacitor which is provided with a first recess provided to the semiconductor substrate and opening in the first surface, an insulating film disposed on an inside surface of the first recess, and an electrically-conductive material filling the first recess, and has a first capacitance between the electrically-conductive material and the semiconductor substrate, wherein
 the electrically-conductive material does not have contact with the terminal at the second surface side.

2. The vibration device according to claim 1, wherein the integrated circuit includes an oscillation circuit configured to oscillate the vibration element to output an oscillation signal, and
 the first capacitor is used to adjust a frequency of the oscillation signal.

3. The vibration device according to claim 2, further comprising:
 a second capacitor which is provided with a second recess provided to the semiconductor substrate and opening in the first surface, an insulating film disposed on an inside surface of the second recess, and an electrically-conductive material filling the second recess, and has a second capacitance different from the first capacitance between the electrically-conductive material and the semiconductor substrate.

4. The vibration device according to claim 3, wherein
an opposed area of the second capacitor to the semiconductor substrate is different from an opposed area of the first capacitor to the semiconductor substrate.

5. The vibration device according to claim 4, wherein the second recess is different in depth from the first recess.

6. The vibration device according to claim 4, wherein in a plan view of the semiconductor substrate, the second capacitor is different in length from the first capacitor.

7. The vibration device according to claim 1, further comprising:
a frame which penetrates the semiconductor substrate, and has an insulating property, wherein
the first capacitor is disposed inside the frame, and
an area inside the frame of the semiconductor substrate has a potential different from a substrate potential.

* * * * *